United States Patent
Moon

(10) Patent No.: US 8,341,470 B2
(45) Date of Patent: Dec. 25, 2012

(54) SEMICONDUCTOR MEMORY DEVICE SUPPORTING READ DATA BUS INVERSION FUNCTION AND METHOD OF TESTING THE SEMICONDUCTOR MEMORY DEVICE

(75) Inventor: Gil-shin Moon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 469 days.

(21) Appl. No.: 12/608,211

(22) Filed: Oct. 29, 2009

(65) Prior Publication Data
US 2010/0122130 A1 May 13, 2010

(30) Foreign Application Priority Data
Nov. 12, 2008 (KR) .................. 10-2008-0112218

(51) Int. Cl.
*G11C 29/00* (2006.01)

(52) U.S. Cl. ..................................... 714/719

(58) Field of Classification Search .................. 714/736, 714/819, 718, 719; 365/201; 326/104, 52
See application file for complete search history.

(56) References Cited

U.S. PATENT DOCUMENTS

| | | | |
|---|---|---|---|
| 5,033,048 A * | 7/1991 | Pierce et al. | 714/719 |
| 5,892,721 A * | 4/1999 | Kim | 365/201 |
| 6,788,106 B2 | 9/2004 | Kwak et al. | |
| 6,992,506 B2 * | 1/2006 | Park et al. | 326/52 |
| 7,120,841 B2 * | 10/2006 | Ohlhoff | 714/718 |
| 7,142,021 B2 | 11/2006 | Park | |
| 7,408,482 B2 * | 8/2008 | Park et al. | 341/55 |
| 7,673,209 B2 * | 3/2010 | Park et al. | 714/738 |

FOREIGN PATENT DOCUMENTS

| | | |
|---|---|---|
| JP | 07-085699 | 3/1995 |
| KR | 100621353 B1 | 8/2006 |
| KR | 1020070045644 A | 5/2007 |

\* cited by examiner

*Primary Examiner* — Phung M Chung
(74) *Attorney, Agent, or Firm* — Myers Bigel Sibley & Sajovec, P.A.

(57) ABSTRACT

Provided is a semiconductor memory device supporting a read data bus inversion (RDBI) function and a method of testing the semiconductor memory device. The method includes: providing data of an input test pattern to data input/output pads; including the data of the input test pattern in a data bus through a memory cell core block; if the data on the data bus satisfy an inversion condition, inverting and outputting the data on the data bus, and generating a flag signal indicating that the data on the data bus are inverted; comparing each of the inverted data on the data bus with the flag signal and transmitting resultant data to the data input/output pads; and determining whether the resultant data transmitted to the data input/output pads are data of an output test pattern.

8 Claims, 2 Drawing Sheets

SEMICONDUCTOR MEMORY DEVICE SUPPORTING READ DATA BUS INVERSION FUNCTION AND METHOD OF TESTING THE SEMICONDUCTOR MEMORY DEVICE

REFERENCE TO PRIORITY APPLICATION

This application claims priority to Korean Patent Application No. 10-2008-0112218, filed Nov. 12, 2008, the content of which is hereby incorporated herein by reference.

BACKGROUND

The inventive concept relates to a semiconductor memory device, and more particularly, to a semiconductor memory device supporting a read data bus inversion (RDBI) function and a method of testing the semiconductor memory device.

Semiconductor memory devices increase an operating frequency in order to increase an operating speed and increase the number of data input/output pins DQs in order to increase the number of data bits that are simultaneously input/output. For example, ultra-high speed semiconductor memory devices operating at a frequency of 500 MHz or higher and having 32 data input/output pins DQs have been popularized.

When a plurality of data are simultaneously output to 32 data input/output pins DQs, the output data generates a considerable amount of noise typically called simultaneous switching noise (SSN). If the SSN increases, the waveform of the output data is damaged, thereby degrading signal integrity. In order to reduce the SSN, semiconductor memory devices adopt a read data bus inversion (RDBI) function of inverting and outputting data when the data is changed above a threshold number.

The RDBI function reads data transmitted to data input/output pins DQs, if the number of data having a high level "H" is greater than the number of data having a low level "L", outputs the data, and if the number of the data having the low level "L," is lower than the number of data having the high level "H", inverts and outputs the data. Semiconductor memory devices supporting the RDBI function must be tested in order to determine whether the RDBI function is normally performed.

In order to test the RDBI function, test equipment for testing a semiconductor memory device provides test patterns that expect data which are input to data input/output pins DQs to be output from the data input/output pins DQs in an inverted mode or a non-inverted mode. The inverted or non-inverted mode may be determined by using a data mask pin DM that sends an inverted flag signal. It takes much time and effort to provide the test patterns.

In order to test the RDBI function in the inverted mode, for example, if the test equipment provides an 8-bit input test pattern "00000111" to a semiconductor memory device having 8 data input/output pins DQs, it is expected that bits "11111000" are output from the data the data input/output pins DQs of the semiconductor memory device and an inverted flag signal having a logic level "1" is output from the data mask pin DM. However, if bits "00000111" are output from the data input/output pins DQs of the semiconductor memory device and an inverted flag signal having a logic level "0" is output from the data mask pin DM, although the RDBI function of the semiconductor memory device passes the test, the test equipment determines that the RDBI function of the semiconductor memory device fails the test. On the contrary, in order to test the RDBI function the non-inverted mode, if the test equipment provides an 8-bit input test pattern "111111000" to the semiconductor memory device, it is expected that bits "11111000" are output from the data input/output pins DQs and an inverted flag signal having a logic level "0" is output from the data mask pin DM. However, if bits "00000111" are output from the data input/output pins DQs and an inverted flag signal having a logic level "1" is output from the data mask pin DM, although the RDBI function of the semiconductor memory device passes the test, the test equipment determines that the RDBI function fails the test, which causes an over-kill problem.

In more detail, if an RDBI logic circuit of the semiconductor memory device is implemented as an analog circuit and an RDBI condition is not satisfied due to a timing margin or a process change, an inverted flag signal may be sent and read data may be inverted. In this case, although a RDBI function passes a test by comparing data in real time, it is regarded as failing the test.

Accordingly, there is a demand for a method of determining an RDBI function only by testing an existing input test pattern, without calculating input test patterns and output test patterns corresponding to the input test patterns and generating a test screen pattern.

SUMMARY

The inventive concept provides a semiconductor memory device supporting a read data bus inversion (RDBI) function which allows a real time data comparison.

The inventive concept also provides a method of testing the semiconductor memory device for verifying the RDBI function.

According to an aspect of the inventive concept, there is provided a semiconductor memory device comprising: a data bus: a data inversion logic circuit, if data bits on the data bus satisfy an inversion condition, inverting and outputting the data bits on the data bus, and generating a flag signal indicating that the data bits on the data bus are inverted; and a data comparison unit comparing each of the data bits output from the data inversion logic circuit with the flag signal and transmitting resultant data bits to data input/output pads.

During a test, data bits of an input test pattern provided to the semiconductor memory device may pass through a memory cell core block and may be placed on the data bus, and it may be determined whether the resultant data bits transmitted to the data input/output pads are the same as the data bits of the input test pattern.

During the test, test equipment may provide the same output test pattern as the input test pattern and determine whether the resultant data bits transmitted to the data input/output pads are the same as the data bits of the output test pattern.

The flag signal may be generated by using pins with no internal connection or pins that are not used in a normal mode.

The data comparison unit may comprise exclusive-OR (XOR) logic circuits each inputting the flag signal and each of the output data bits of the data inversion logic circuit.

According to another aspect of the present inventive concept, there is provided a method of testing a semiconductor memory device, the method comprising: providing data bits of an input test pattern to data input/output pads; causing the data bits of the input test pattern to pass through a memory cell core block and to be placed on a data bus; if the data bits on the data bus satisfy an inversion condition, inverting and outputting the data bits on the data bus, and generating a flag signal indicating that the data bits on the data bus are inverted; comparing each of the inverted data bits on the data bus with the flag signal and transmitting resultant data bits to the data input/output pads; and determining whether the resultant data bits transmitted to the data input/output pads are data bits of an output test pattern.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
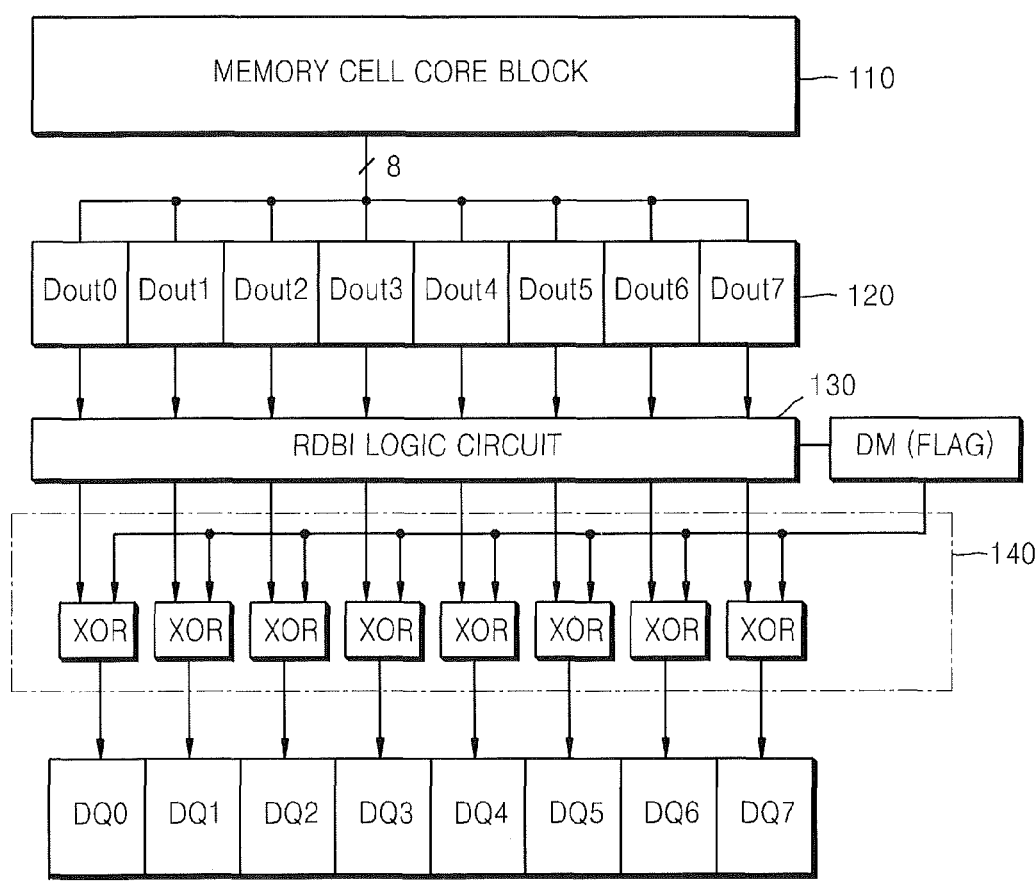
FIG. 1 is schematic view of a semiconductor memory device according to an embodiment of the present inventive concept.

The above and other features and advantages of the present inventive concept will become more apparent by describing in detail exemplary embodiments thereof with reference to the attached drawings.

The present inventive concept will now be described more fully with reference to the accompanying drawings, in which exemplary embodiments of the present inventive concept are shown. In the drawings, the same reference numerals denote the same elements.

FIG. 1 is a schematic view of a semiconductor memory device 100 according to an embodiment of the present inventive concept. Referring to FIG. 1, that the semiconductor memory device 100 simultaneously inputs and outputs 8 bit data to/from a memory cell core block 110 through 8 data input and output pins DQ0 through DQ7. The memory cell core block 110 includes a memory cell array (not shown) including memory cells arranged at intersections between a plurality of word lines and a plurality of bit lines, address decoders (not shown) activating selected word lines and selected bit lines in response to an external address signal, and sense amplifiers (not shown) sensing and amplifying a plurality of pieces of memory cell data read from the selected bit lines and transmitting the amplified memory cell data to a data bus 120.

The data bus 120 transmits a plurality of read data Dout0 through Dout7 a read data bus inversion (RDBI) logic circuit 130. The RDBI logic circuit 130 reads the read data Dout0 through Dout7, and operates in a non-inverted mode in which the read data bits Dout0 through Dout7 are output if the number of bits having a high level "1" is greater than the number of bits having a low level "0" and operates in an inverted mode in which the read data bits Dout0 through Dout7 are inverted and output if the number of bits having the low level "0" is greater than the number of bits having the high level "1". When the RDBI logic circuit 130 operates in the non-inverted mode, the RDBI logic circuit 130 generates a flag signal FLAG having the low level "0" by using a data mask pin DM. This flag signal is also set to a low level "0" when the number of bits having a "1" level equals a number of bits having a "0" level. When the RDBI logic circuit 130 operates in the inverted mode, the RDBI logic circuit 130 generates a flag signal FIAG having the high level "1" by using the data mask pin DM. Although the data mask pin DM is used to generate the flag signal FLAG in present embodiment, no connection (NC) pins or pins that are not used in a normal mode included in the RDBI logic circuit 130 may be used to generate the flag signal FLAG.

The non-inverted/inverted read data Dout0 through Dout7 output by the RDBI logic circuit 130 are transmitted to a data comparison unit 140. The data comparison unit 140 compares each of the non-inverted/inverted read data Dout0 through Dout7 output by the RDBI logic circuit 130 with the flag signal FLAG. The data comparison unit 140 includes exclusive-OR (XOR) logic circuits each inputting each of the non-inverted/inverted read data Dout0 through Dout7 and the flag signal FLAG.

If the read data Dout0 through Dout7 on the data bus 120 include bits "10010010", since the number of the bits having the low level "'0" is greater than the number of the bits having the high level "1" among the read data Dout0 through Dout7, the RDBI logic circuit 130 outputs the bits "01101101", and the flag signal FLG having the high level "1" is output. The data comparison unit 140 sends the bits "10010010", which are obtained by performing XOR with regard to each of the bits "01101101" output by the RDBI logic circuit 130 and the flag signal FLAG having the high level "1", to the data input/output pins DQ0 through DQ7. The bits "10010010" output to the data input/output pins DQ0 through DQ7 are the same as the read data Dout0 through Dout7 on the data bus 120.

Likewise, if the read data Dout0 through Dout7 on the data bus 120 include bits "11111010", since the number of the bits having the high level "1" is greater than the number of the bits having the low level "0" among the read data Dout0 through Dout7, the RDBI logic circuit 130 outputs bits "11111010", which are non-inverted read data, and a flag signal FLAG having the low level "0" is output. The data comparison unit 140 sends the bits "11111010", which are obtained by performing XOR with regard to each of the bits "11111010" output by the RDBI logic circuit 130 and the flag signal FLAG having the low level "0", to the data input/output pins DQ0 through DQ7. The bits "11111010" output to the data input/output pins DQ0 through DQ7 are the same as the read data Dout0 through Dout7 on the data bus 120.

Test equipment for testing the semiconductor memory device 100 writes a predetermined input test pattern, for example, data bits "10010010", to selected memory cells in the memory cell core block 110 by using the data input/output pins DQ0 through DQ7. Next, the test equipment applies a read command to the semiconductor memory device 100 to read data from the selected memory cells and to include the read data in the data bus 120. If the semiconductor memory device 100 is a good product, the read data Dout0 through Dout7 on the data bus 120 include bits "10010010", which are then output to the data input/output pins DQ0 through DQ7. That is, although the input test pattern "10010010" provided by the test equipment is inverted by the RDBI logic circuit 130 that supports the RDBI function in the semiconductor memory device 100, since the data comparison unit 140 that compares each of the data bits output by the RDBI logic circuit 130 with the flag signal FLAG sends the same pattern as the input test pattern to the data input/output pins DQ0 through DQ7, the test equipment can provide the input test pattern and an output test pattern of the semiconductor memory device 100 that is the same as the input test pattern.

The semiconductor memory device according to the present inventive concept can support an RDBI function and be tested by using the same output test pattern as an existing input test pattern.

Figure 2:
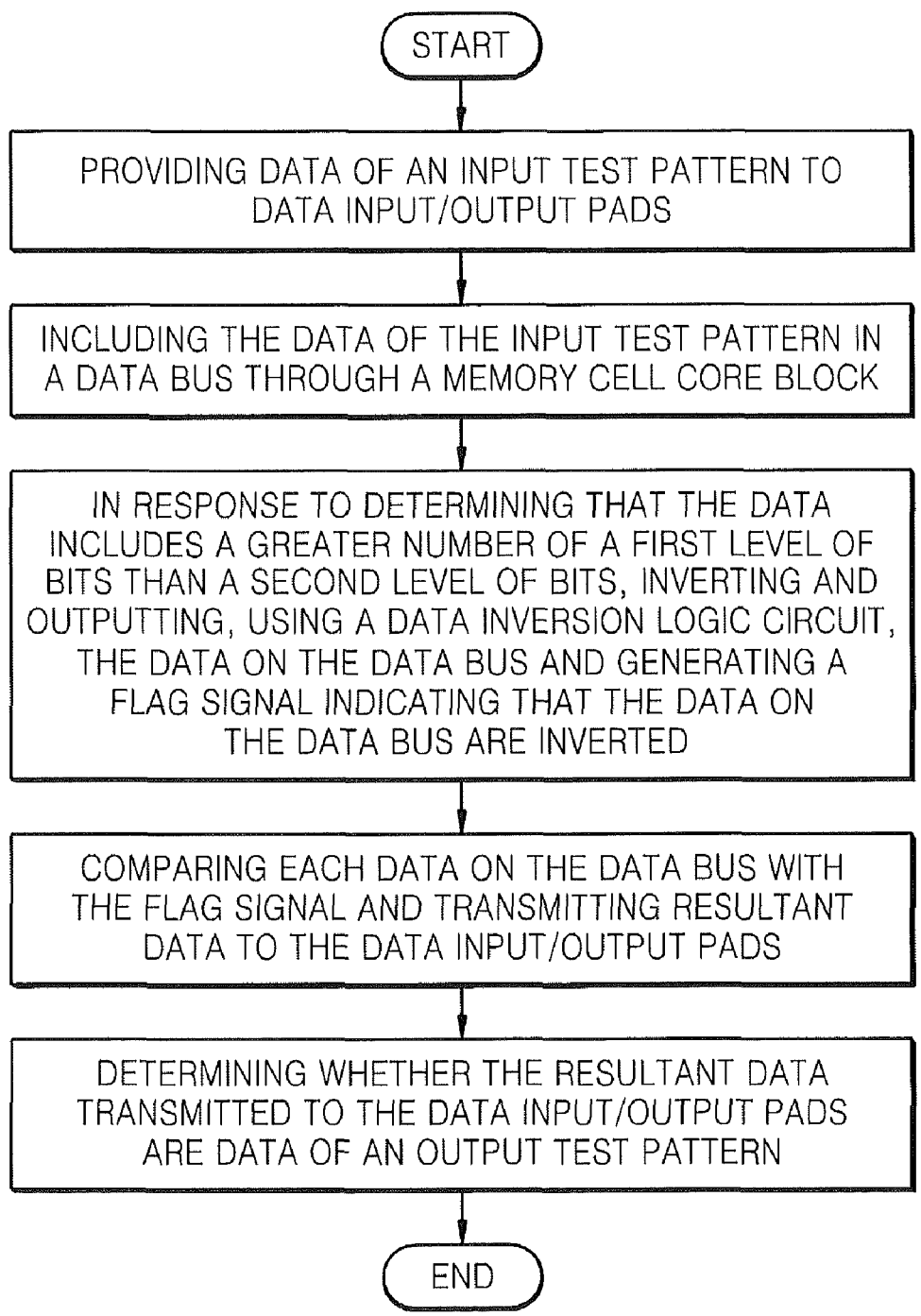
FIG. 2 is a flowchart illustrating operations of testing a semiconductor memory device, according to various embodiments.

Referring now to FIG. 2, a flowchart is provided illustrating operations of testing a semiconductor memory device, according to various embodiments. For example, the operations may include providing data of an input test pattern to data input/output pads (Block 201). The operations may also include including the data of the input test pattern in a data bus 120 through a memory cell core block 110 (Block 202). Moreover, in response to determining that the data includes a greater number of a first level of bits than a second level of bits, the operations may include inverting and outputting, using a data inversion logic circuit 130, the data on the data bus 120, and generating a flag signal indicating that the data on the data bus 120 are inverted (Block 203). The operations may further include comparing each data on the data bus 120 with the flag signal and transmitting resultant data to the data input/output pads (Block 204). The operations may additionally include determining whether the resultant data transmitted to the data input/output pads are data of an output test pattern (Block 205).

While the inventive concept has been particularly shown and described with reference to exemplary embodiments thereof, it will be understood that various changes in form and details may be made therein without departing from the spirit and scope of the following claims.

What is claimed is:

1. A semiconductor memory device comprising:
   a data bus;
   a data inversion logic circuit configured to invert and output data on the data bus in response to determining that the data includes a greater number of a first level of bits than a second level of bits, the data inversion logic circuit further configured to generate a flag signal indicating that the data on the data bus are inverted; and
   a data comparison unit including exclusive-OR (XOR) logic circuits, each of which is configured to perform an XOR operation using the flag signal and a respective bit included in the output data from the data inversion logic circuit and to transmit resultant data to data input/output pads,
   wherein the resultant data includes the same pattern of bits as the data on the data bus for all values of the flag signal when the data inversion logic circuit is functioning properly.

2. The semiconductor memory device of claim 1, further comprising a memory cell core block, wherein the semiconductor memory device is configured to be tested by providing a plurality of data of an input test pattern to the data bus through the memory cell core block, and determining whether the resultant data transmitted to the data input/output pads are the same as the data of the input test pattern.

3. The semiconductor memory device of claim 1, wherein the flag signal is generated by using a data mask pin.

4. The semiconductor memory device of claim 1, wherein the flag signal is generated by using no connection (NC) pins or pins that are not used in a normal mode.

5. A method of testing a semiconductor memory device, the method comprising:
   providing data of an input test pattern to data input/output pads;
   including the data of the input test pattern in a data bus through a memory cell core block;
   in response to determining that the data includes a greater number of a first level of bits than a second level of bits, inverting and outputting, using a data inversion logic circuit, the data on the data bus, and generating a flag signal indicating that the data on the data bus are inverted;
   comparing each data on the data bus with the flag signal and transmitting resultant data to the data input/output pads; and
   determining whether the resultant data transmitted to the data input/output pads are data of an output test pattern,
   wherein the resultant data includes the same pattern of bits as the data on the bus for all values of the flag signal when the data inversion logic circuit is functioning properly.

6. The method of claim 5, wherein the output test pattern and the input test pattern include the same pattern of bits.

7. The method of claim 5, further comprising: determining whether the flag signal is generated by using a data mask pin.

8. The method of claim 5, further comprising: determining whether the flag signal is generated by using no-connection NC pins or pins that are not used in a normal mode.

* * * * *